(12) United States Patent
Noh et al.

(10) Patent No.: US 6,674,686 B2
(45) Date of Patent: Jan. 6, 2004

(54) METHOD AND APPARATUS FOR READ OPERATION AND WRITE OPERATION IN SEMICONDUCTOR MEMORY DEVICE

(75) Inventors: Yong-Hwan Noh, Suwon (KR); Young-Ho Suh, Suwon (KR)

(73) Assignee: Samsung Electronics Co., Ltd. (KR)

( * ) Notice: Subject to any disclaimer, the term of this patent is extended or adjusted under 35 U.S.C. 154(b) by 70 days.

(21) Appl. No.: 10/037,906

(22) Filed: Nov. 9, 2001

(65) Prior Publication Data

US 2002/0154565 A1 Oct. 24, 2002

(30) Foreign Application Priority Data

Apr. 18, 2001 (KR) .................................. 2001-20783

(51) Int. Cl.$^7$ ................................................ G11C 8/00
(52) U.S. Cl. .............. 365/233; 365/189.01; 365/189.05
(58) Field of Search ........................... 365/233, 189.05, 365/189.01, 189.04, 190, 203, 207, 230.05; 711/143, 155, 167

(56) References Cited

U.S. PATENT DOCUMENTS 5,500,820 A * 3/1996 Nakaoka ............... 365/189.01
5,761,147 A * 6/1998 Lindner et al. ........ 365/230.05
6,069,839 A * 5/2000 Pancholy et al. ........... 365/233
6,073,219 A * 6/2000 Ohno ........................ 711/155
6,292,403 B1 * 9/2001 Pancholy et al. ...... 365/189.05

* cited by examiner

*Primary Examiner*—Hoai Ho
*Assistant Examiner*—Gene N. Auduong
(74) *Attorney, Agent, or Firm*—F. Chau & Associates, LLP

(57) ABSTRACT

Methods and apparatus for performing read and write operations in a semiconductor memory device comprising an I/O (input/output) architecture comprising a separate data input bus and data output bus. Read and write operations are sequentially performed in a same cycle using QDR2 (Quadruple Data Rate 2) wherein each of the input and output modes operate at a 2-bit burst mode and a double data rate (DDR) mode, thereby minimizing cycle time or read and write operations are sequentially performed in a same cycle using QDR4 (Quadruple Data Rate 4), wherein each of the input and output modes operate at a 4-bit burst mode and a DDR mode, thereby minimizing the cycle time. In another aspect, when a read command is input in one cycle, a read operation is performed in synchronization with a rising edge of clock and a write operation is performed in synchronization with a signal that operates during the read operation.

28 Claims, 7 Drawing Sheets

METHOD AND APPARATUS FOR READ OPERATION AND WRITE OPERATION IN SEMICONDUCTOR MEMORY DEVICE

BACKGROUND

1. Technical Field

The present invention relates to a semiconductor memory device and, particularly, to a method and an apparatus for performing read and write operations in a semiconductor memory device comprising an I/O (input/output) architecture comprising a separate data input bus and data output bus. More particularly, the present invention relates to a method and an apparatus for performing read and write operations in an order such that write and read operations can be performed in cells associated with the same bit line.

2. Description of Related Art

As a consequence of a continued demand for systems providing high-speed operation and low electric power consumption, semiconductor memory devices are continually being developed that are suitable for enabling high-speed operation and the low electric power consumption. In a semiconductor memory device, a synchronous static random access memory device (SSRAM) performs read/write operations in response to an external clock signal. To obtain high-speed operation of a synchronous semiconductor memory device, a double data rate (DDR) mode is typically utilized in which dual clock is generated thereby doubling the clock speed (as compared with a single data rate mode (SDR)).

Typically, SDR and DDR semiconductor memory devices comprise an I/O structure comprising a common data input bus and data output bus. Since the data input bus and the data output bus cannot be operated at the same time, however, the data rate will be lowered when read and write commands are input at the same time in the same cycle. If a semiconductor memory device comprises an input/output structure in which the data input bus and data output bus are separated, the device can realize a substantial increase in the data rate in the same cycle time because the data input bus and the data output bus can simultaneously be operated.

SUMMARY OF THE INVENTION

It is an object of the present invention to provide a semiconductor device comprising an I/O architecture comprising a separate data input bus and data output bus.

It is another object of this invention to provide a method and an apparatus for simultaneously utilizing a data input bus and a data output bus in a separate input/output DDR or quadruple data rate RAM, whereby a semiconductor memory device can realize a data rate more than two times in a same cycle time and sequentially perform read and write operations in the same cycle.

It is another object of the present invention to provide a method and an apparatus for read and write operation in a semiconductor memory device by which read and write operations are sequentially performed in a same cycle when read and write operations are performed in a separate I/O DDR or QDR (2/4) RAM, thereby minimizing the cycle time.

In one aspect of the present invention, a method for performing read and write operations in a semiconductor memory device comprising an I/O (input/output) architecture comprising a separate data input bus and a data output bus, comprises the steps of:

performing a read operation in synchronization with a clock signal when a read command is input at one cycle; and performing a write operation in synchronization with a signal that operates during the read operation.

The signal that operates during the read operation may comprises a decoding signal, a main data line signal, or a sense amplifier enable signal that is enabled during the read operation.

In another aspect, a method for performing read and write operations further comprises performing a write operation in synchronization with the clock that is synchronized during a read operation if the read command is not input in the one cycle.

In yet another aspect, the cycle time in the one cycle is determined by the sum of a minimum cycle time for a read operation and a minimum cycle time for a write operation.

In another aspect, the I/O operates at a 4-bit burst double data rate using one of a 2 and 4-bit prefetch mode.

According to yet another aspect of the present invention, a method for performing read and write operations in a semiconductor memory device comprising an I/O architecture comprising a separate data input bus and data output bus, comprises the steps of:

performing a write operation in synchronization with a clock when a write command is input at one cycle; and performing a read operation in synchronization with a signal that operates during the write operation.

The signal that operates during the write operation may comprise a decoding signal that is enabled during the write operation, a write driver enable signal, or a write driver disable signal.

According to yet another aspect, the method for performing read and write operations further comprises performing a read operation in synchronization with the clock that is synchronized during a write operation if the write command is not input in the one cycle.

In another aspect, the cycle time in the one cycle is determined by the sum of a minimum cycle time for a write operation and a minimum cycle time for a read operation.

In yet another aspect, the I/O operates at a 4-bit burst double data rate using one of a 2 and 4 bit prefetch mode.

In another aspect, in the write operation, when data is input earlier than a write address, a write operation is performed in a following write cycle.

In yet another aspect of the present invention, an apparatus for performing read and write operations in a semiconductor memory device comprising an I/O (input/output) architecture comprising a separate data input bus and data output bus comprises:

an address register for latching an a read address or a write address;

a clock buffer for receiving clock signals;

a decoder for decoding a read or write address that is latched by the address register;

a memory cell array for enabling word lines and row paths in response to an address decoding signal received from the decoder;

a sense amplifier that is enabled for a read operation when a word line and a row path are enabled;

a write driver that is enabled for a write operation to write data in a cell when a word line and a row path are enabled;

a data output register for latching output data and outputting the output data in synchronization with a clock in a following cycle after the sense amplifier is enabled;

a data input register; and a controller for tracking a random signal that operates during an earlier read or write operation to thereby perform a subsequent write or read operation.

BRIEF DESCRIPTION OF THE DRAWINGS

The foregoing and other objects, aspects and advantages of the present invention will be described or become apparent from the following detailed description of preferred embodiments with reference to the drawings, in which.

DETAILED DESCRIPTION OF PREFERRED EMBODIMENTS

The following terms and abbreviations as used in the following description of preferred embodiments are defined as follows:

QDR2: Quadruple Data Rate 2, which indicates a separate input and output architecture in which a data input buffer and a data output buffer are separated, and each of the input and output modes operate at a 2-bit burst mode and a double data rate (DDR) mode;

QDR4: Quadruple Data Rate 4, which indicates a separate input and output architecture in which a data input buffer and a data output buffer are separated, and each of the input and output modes operate at a 4-bit burst mode and a DDR mode;

CLK1: clock1 (first clock);

CLK2: clock2 (second clock);

RA: Read Address (read address);

WA: Write Address (write address);

D: Data Input (data input);

Q: Data Output (data output);

Y-Path: row path; and

NOP: No Operation.

Hereinafter, preferred embodiments of the present invention will be explained with reference to the accompanying drawings. A detailed description of functions or structures that are well known to those skilled in the art will be omitted.

Figure 1:
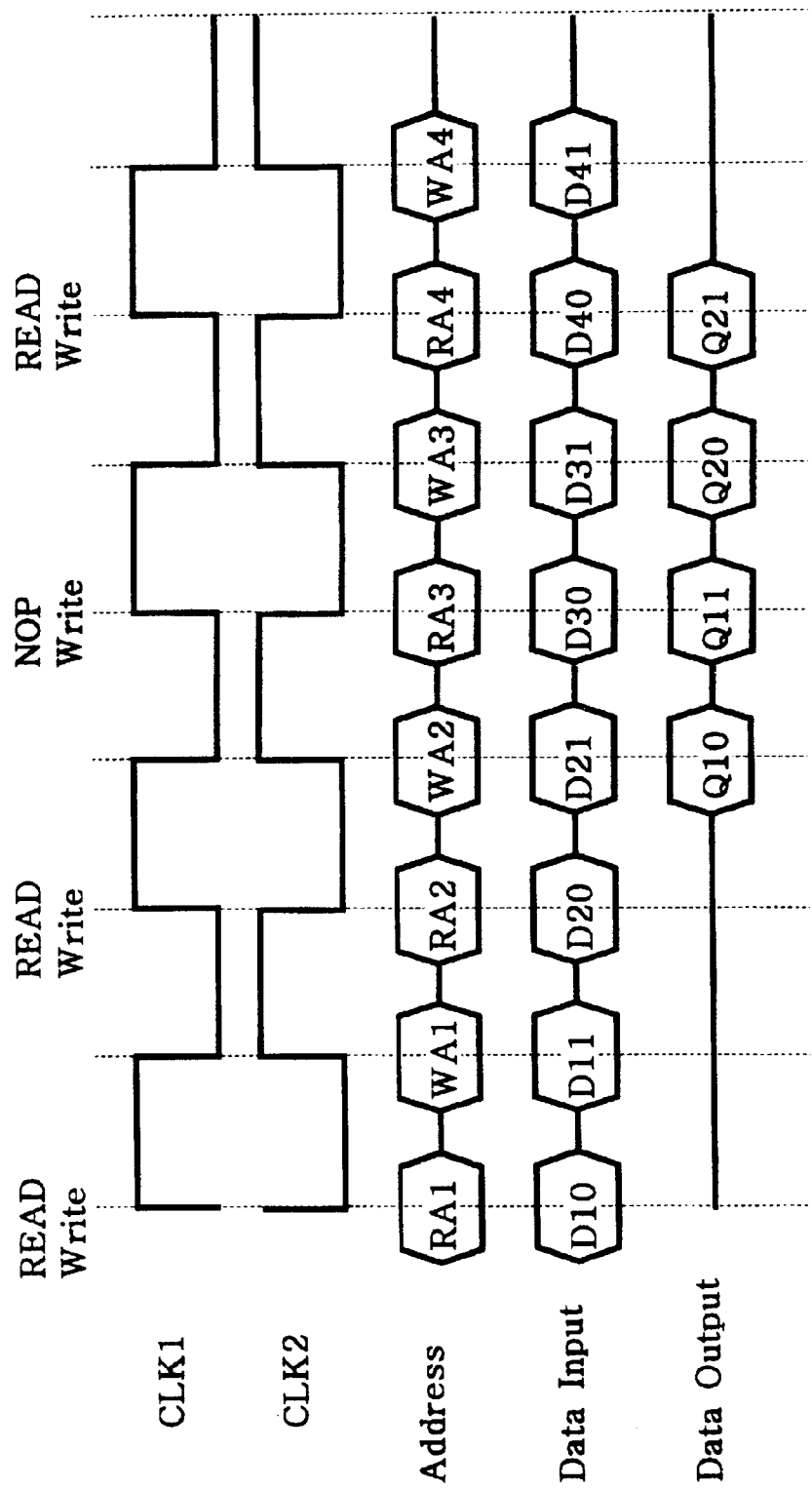
FIG. 1 is a timing diagram of QDR2 method according to one aspect of the invention.

Referring now to FIG. 1, a timing diagram illustrates a QDR2 method according to an embodiment of the invention. With this method, read and write commands are input at the rising edge of CLK1, read addresses are input at the rising edge of CLK1, and write addresses are input at the rising edge of CLK2. Moreover, data input occurs at the rising edges of both CLK1 and CLK2. The data input is an "early write", meaning that data is input earlier than the write address. For example, the data input D10, D11 is associated with WA1. The data output is pipelined by 1 cycle and thereafter output at DDR. For example, the output data Q10, Q11 corresponds to RA1. In the timing diagram of FIG. 1, since read and write commands and the corresponding address and data are input or output every cycle, read and write operations should be performed every cycle. If a read and write operation is to be performed in a cell associated with the same bit line, however, the read and write operations are sequentially performed.

There are various methods for sequentially performing read and write operations in one cycle according to the present invention. In a first embodiment, a read operation is synchronized with a rising edge of a first clock, CLK1, and a write operation is synchronized with a rising edge of a second clock CLK2. In a second embodiment, a write operation is synchronized with a rising edge of CLK1, and a read operation is synchronized with a rising edge of CLK2. In a third embodiment, a read operation is synchronized with a rising edge of CLK1, and a write operation is performed by tracking a random signal that operates during the read operation. In a fourth embodiment, a write operation is synchronized with a rising edge of CLK1, and a read operation is performed by tracking a random signal that operates during the write operation. A more detailed description of these methods will now be provided.

Figure 2:
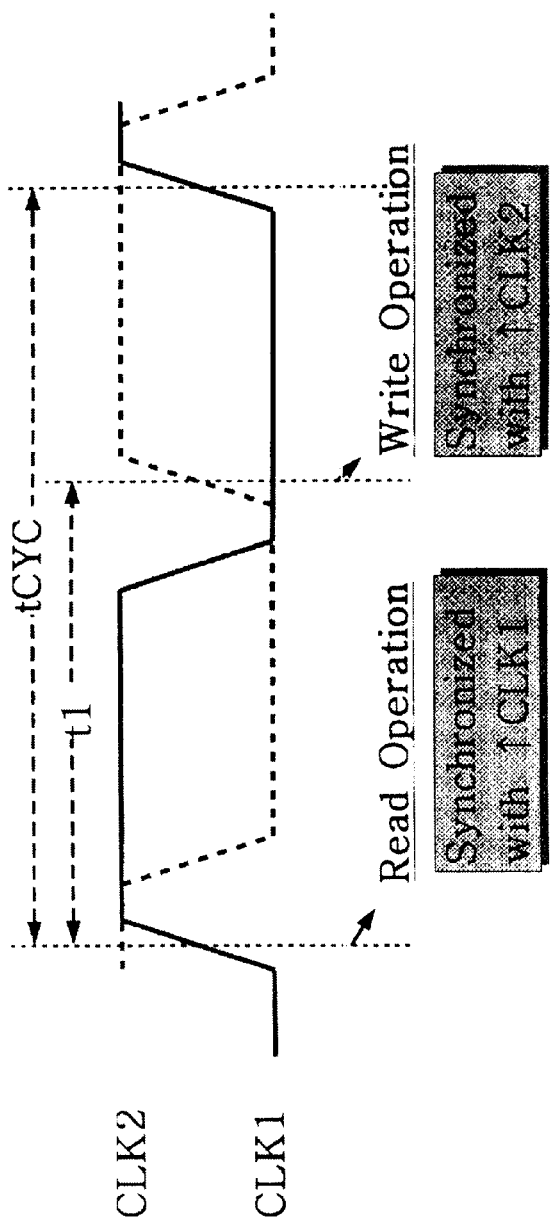
FIG. 2 is a diagram illustrating methods for performing a read or write operation according to embodiments of the present invention.

FIG. 2 is a diagram illustrating a first method for sequentially performing a read and write operation in one cycle according to the present invention. As shown in FIG. 2, a read operation is synchronized with the rising edge of CLK1 and a write operation is synchronized with the rising edge of CLK2. Assuming tCYC denotes a minimum cycle time for 1 cycle, and assuming t1 denotes a time distance between the rising edge time of CLK1 and the rising edge time of CLK2, if the value of t1 is provided as follows:

$$(tCYC/2-\alpha) \leq t1 \leq (tCYC/2+\beta) \quad (1)$$

wherein, $\alpha$ and $\beta$ denote a change in time difference between the rising edge of the first clock and the rising edge of the second clock, then the minimum cycle time in one cycle is provided as follows:

$$tCYC = 2 \times \{MAX[tCYC(\text{Read})+\alpha, tCYC(\text{Write})+\beta]\} \quad (2)$$

wherein, tCYC(Read) is a minimum cycle time that is necessary for a read operation, tCYC(Write) is a minimum cycle time that is necessary for a write operation, and MAX[tCYC(Read)+$\alpha$, tCYC(Write)+$\beta$] denotes a function for selecting a larger value of the two values (e.g., when the function is given as MAX[a,b], if "a" is larger than or equal to "b", the value of the function MAX[a,b] is "a").

The above equation (2) means that there are two factors that define the cycle time. First, the greater of the read cycle time and the write cycle time affects the cycle time. If t1 exactly indicates tCYC/2, it means that tCYC for a normal operation of memory should be twice the greater of the read cycle time and the write cycle time. That is, the worst cycle time out of the read cycle time and the write cycle time will determine the entire cycle time.

The above equation (2) further means that the cycle time depends on the change width in time difference between the rising edge of the CLK1 and the rising edge of the CLK2. The greater the change width, the more the cycle time increases. If the CLK1 and the CLK2 are different in clock to each other, t1 means duty cycle of CLK1 and CLK2.

In a second embodiment, a writing operation is synchronized with the rising edge of CLK1, and a reading operation is synchronized with the rising edge of CLK2. In other words, the order of the write operation and the read operation in FIG. 2 is reversed for the second embodiment. When the second method is designated by the above formula (1), the minimum cycle time in 1 cycle of memory will be provided as follows:

$$tCYC=2\times\{MAX[tCYC(\text{Write})+\alpha, tCYC(\text{Read})+\beta]\} \quad (3)$$

where tCYC(Write) is the minimum cycle time that is necessary for a write operation and tCYC(Read) is the minimum cycle time that is necessary for a read operation.

As shown in the above equation (3), the cycle time is determined in the same manner as in the first method described above. However, the read data output speed is slower than in the first method. That is, the speed from the rising edge of CLK1 to the data output becomes slower and the cycle time is accordingly affected.

Figure 3:
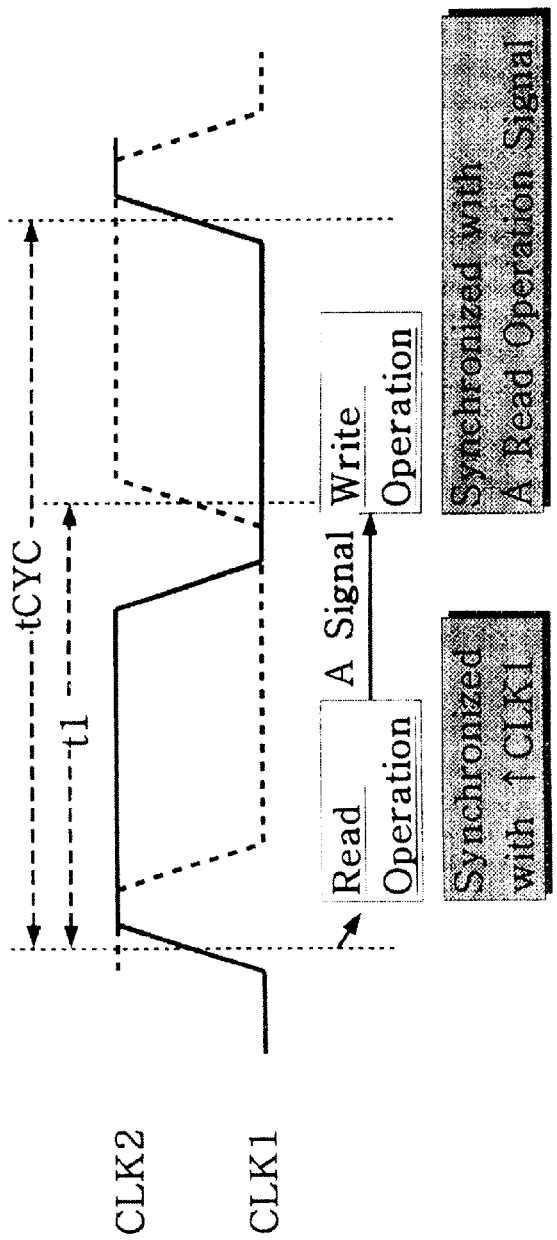
FIG. 3 is a diagram illustrating method for performing read and write operations according to other embodiments of the present invention.

A third embodiment for read and write operations will be described with reference to FIG. 3, wherein a read operation is synchronized with the rising edge of CLK1 and a write operation is performed by tracking a random signal (A Signal) that is generated during the read operation. The term "tracking" means being synchronized with a random signal. With this method, the cycle time is minimized by removing the component that limits the cycle time in the first and second methods. The cycle time in one cycle is determined by the sum of the minimum cycle time that is necessary in a read operation and the minimum cycle time that is necessary in a write operation, as provided by the following equation:

$$tCYC=tCYC(\text{Read})+tCYC(\text{Write}) \quad (4)$$

The third method is different from the first and second methods in various respects. For instance, since a write operation is synchronized with a random signal (as explained in detail below with reference to FIG. 5) that is operated during a read operation and performed after the read operation completes, the total cycle time is determined by the sum of the read cycle time and the write cycle time. Accordingly, the worst cycle time of the read cycle time and the write cycle time effects the entire cycle time and is removed.

Another difference between the third method and the first and second methods described above is that the cycle time is not affected by the change width ($\alpha,\beta$) in time difference between the rising edge time of the CLK1 and the rising edge time of the CLK2.

In a fourth embodiment, a write operation is synchronized with the rising edge of the CLK1 and a read operation is performed by tracking a random signal that operates during the write operation. Essentially, the fourth method is the reverse of the read operation and the write operation shown in FIG. 3. The cycle time in one cycle is determined in the same manner as the third method. However, the output speed of read data is slower than in the third method. When the read address is input to the rising edge of the CLK2 as shown in FIG. 1, writing data in a cell is performed by a late write. For example, as shown in FIG. 1, the write operation of WA1 cell is performed at the second cycle.

Figure 4:
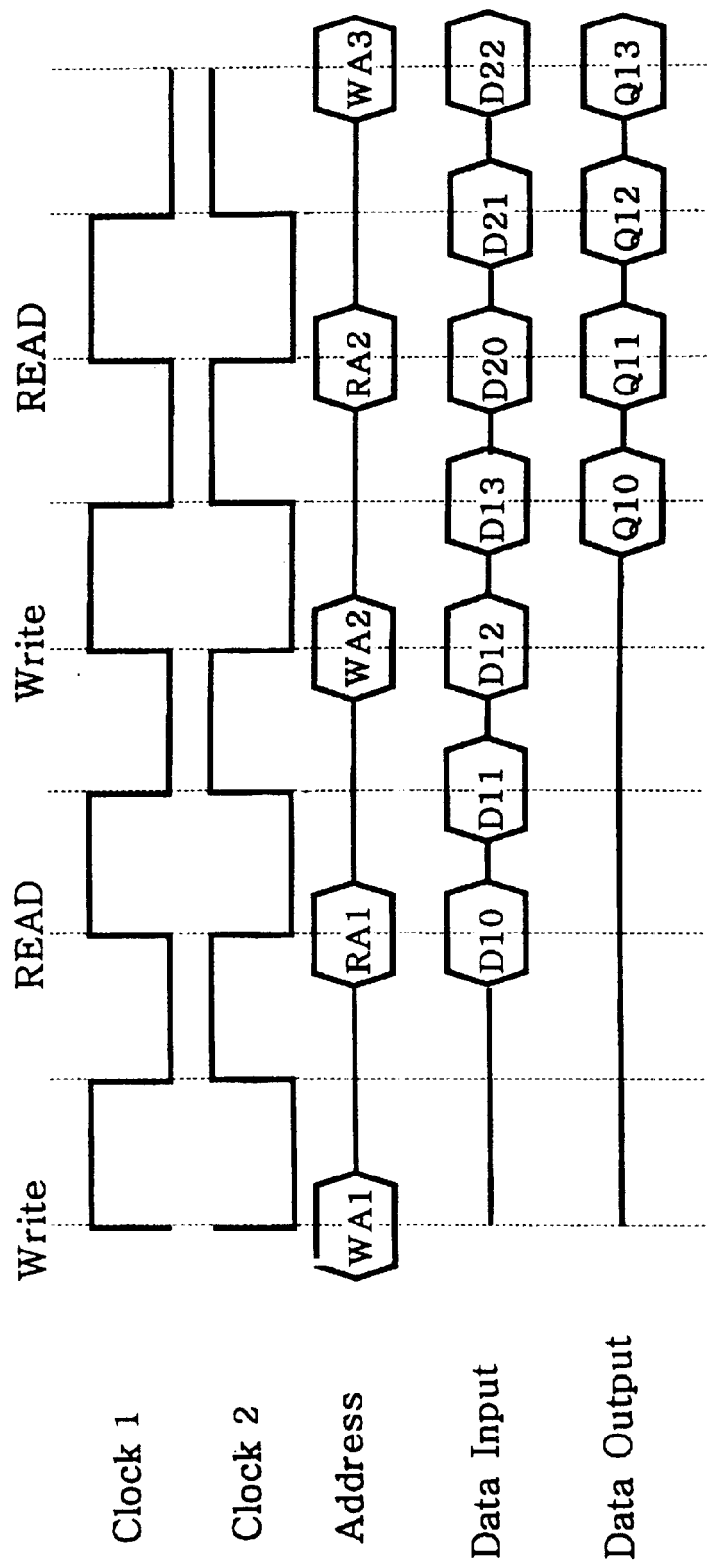
FIG. 4 is a timing diagram of QDR4 method according to an embodiment of the present invention.

FIG. 4 is a timing diagram of a QDR4 method according to another embodiment of the present invention. Referring to FIG. 4, a read or write command is input at the rising edge of CLK1, an address is input at the rising edge of CLK1, and data is input at the rising edges of CLK1 and CLK2. A late write operation is performed for which data is input later than the write address and data of 4 bits per one address is input during 2 cycles (the second cycle performs a burst operation). For example, data input corresponding to WA1 is D10, D11, D12, D13, and data output corresponding to RA1 is Q10, Q11, Q12, Q13, as shown in FIG. 4. A QDR4 memory operation having the timing shown in FIG. 4 can be performed by using a 4-bit prefetch method or a 2-bit prefetch method. The 4-bit prefetch method is performed in such a manner that 4 data bits are read or written in a cell during 1 cycle, and a read operation and a write operation does not need to be performed at the same time every cycle.

Moreover, a 2-bit prefetch method is performed in such a manner that two data bits are read and written in a cell per 1 cycle. As shown in FIG. 4, when a write command is input at the first cycle, two data bits are written in a cell and the other two data bits are written in a write burst mode at the second cycle. And, since a read command was input at the second cycle, a read operation is performed. Two data bits are read at the second cycle, and the other two data bits are read in a burst mode during the third cycle. Thus, read and write operations should be performed every cycle, similar to the operation in FIG. 1. The 2-bit prefetch method has an advantage that its chip size is smaller and peak current is lower than in the 4-bit prefetch method.

Figure 5:
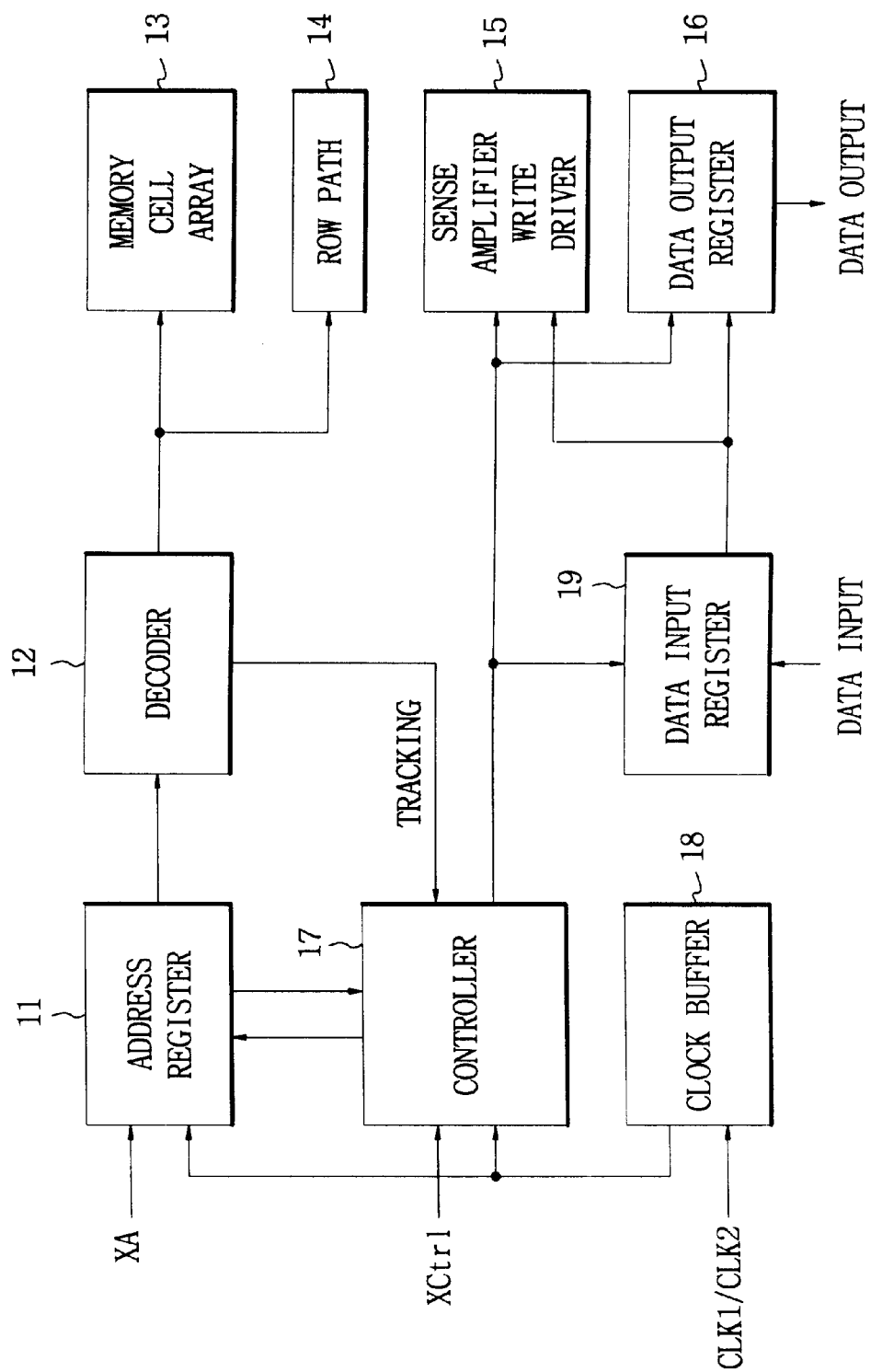
FIG. 5 is a block diagram of a semiconductor memory device according to an embodiment of the present invention for implementing read and write operations.

Referring now to FIG. 5, a block diagram illustrates a semiconductor memory device according to an embodiment of the present invention for implementing the third and fourth methods for read and write operations as described above. The semiconductor memory device comprises an address register 11 for receiving an address signal to latch a read or a write address, a clock buffer 18 for receiving clock signals CLK1/CLK2, a decoder 12 for decoding the read or write address that is latched by the address register 11, a memory cell array 13 for enabling word lines and row paths (Y-Path) in response to a decoded read or write address signal is input, a sense amplifier 15 that is enabled for a read operation when the word line and the row path are enabled, a write driver 15 that is enabled for a write operation to write data in a cell when the word line and the row path 14 are enabled, a data output register 16 for latching data to synchronize the data with a clock in a following cycle to thereafter output such data after the sense amplifier 15 is enabled, a data input register 19, and a controller 17 for tracking a signal that operates during a read operation (or, a write operation, in case that write operation is first performed) to perform a write operation (or, a read operation, in case that write operation is first performed).

In the embodiment of FIG. 5, a read operation is performed as follows. When a read command is input, the read address is latched by the address register 11 and then decoded by the decoder 12 to thereby enable a word line of the memory cell array 13 and a row path 14. The sense amplifier 15 is enabled to thereby latch data to the data output register 16 to thereafter synchronize the output of such data with a clock in a following cycle.

Moreover, a write operation is performed as follows. If a write command is input, a write address is latched to the address register 11 and decoded through the decoder 12, thereby enabling the word line of the memory cell array 13 and the row path 14 and enabling the write driver 15. Thereafter, data is registered in a cell.

When the read address is decoded by the decoder 12, the controller 17 operates to track a read address decoding signal from the decoder 12 to thereby generate a control signal and to control decoding of the write address.

If the write address is first decoded by the decoder 12, the controller 17 tracks a write address decoding signal from the decoder 12 to thereby generate a control signal to control decoding of the read address.

FIG. 5 illustrates an example of a tracking signal that comprises a decoding signal of the decoder 12. It is to be appreciated that any suitable signal (other than the decoding signal) that operates during a read operation (or write operation in the case that a write operation is first performed) can be implemented as a tracking signal. For instance, when a read operation is first performed, the tracking signal may comprise one of a main data line signal, a sense amplifier enable signal SAE, etc. While a write operation is first performed, the tracking signal may comprise a write driver enable/disable signals (WDE/WDD), etc.

Figure 7:
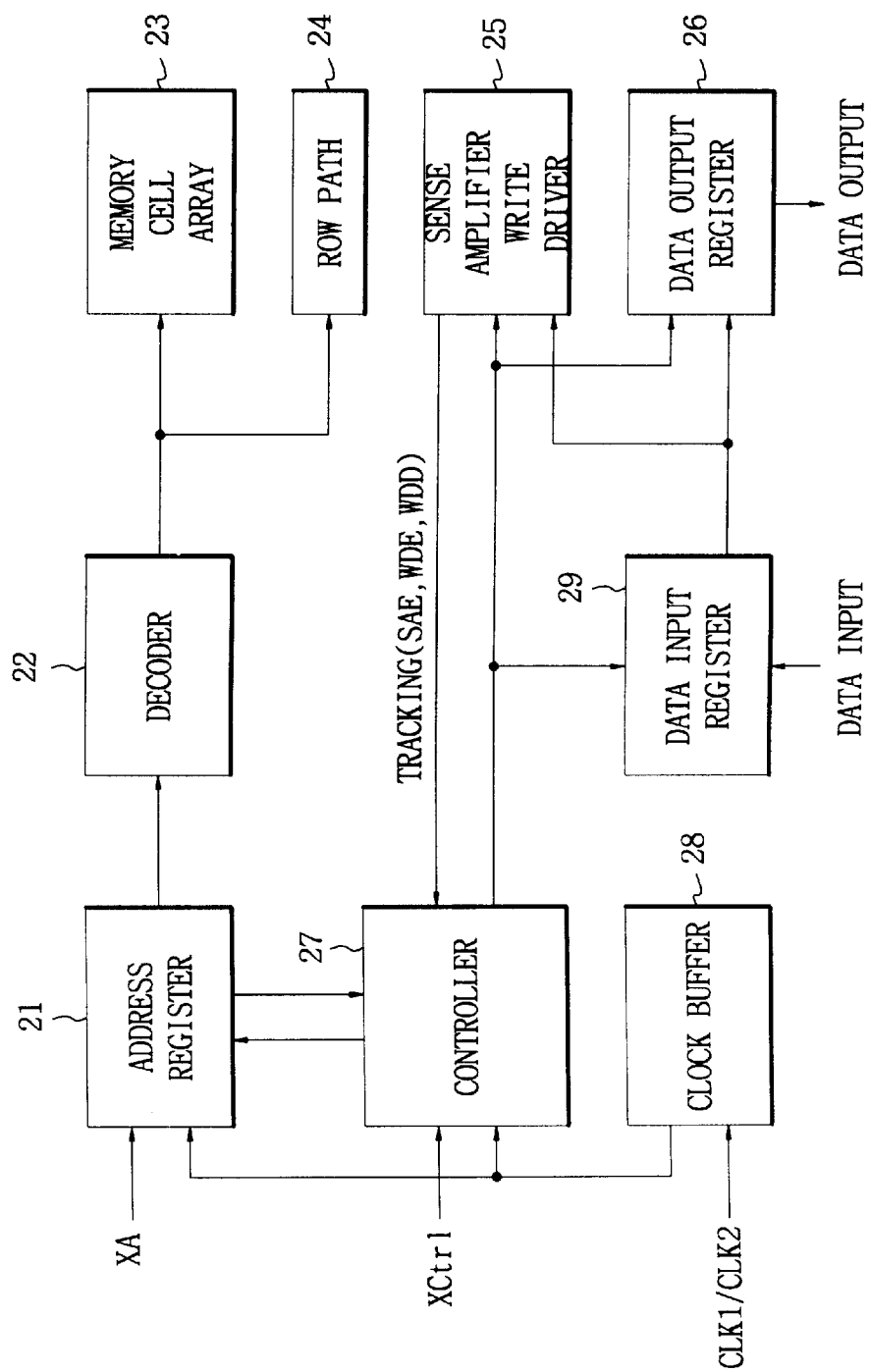
FIG. 7 is a block diagram of a semiconductor memory device according to another embodiment of the present invention for implementing read and write operations.

FIG. 7 is a block diagram of a semiconductor memory device according to another embodiment of the present invention for implementing the third and fourth methods for read and write operations. In this embodiment, SAE signal (or WDE signal, or WDD signal) are employed as the tracking signal of the controller 27.

In the tracking method by which a write operation is performed in synchronization with a read signal, the controller 17, 27 is synchronized with a clock to thereby perform a write operation if a read command is not input in the write cycle. And, in the tracking method by which a read operation is performed in synchronization with a write signal, the controller 17, 27 is synchronized with a clock to thereby perform a read operation if a write command is not input in the read cycle.

Figure 6:
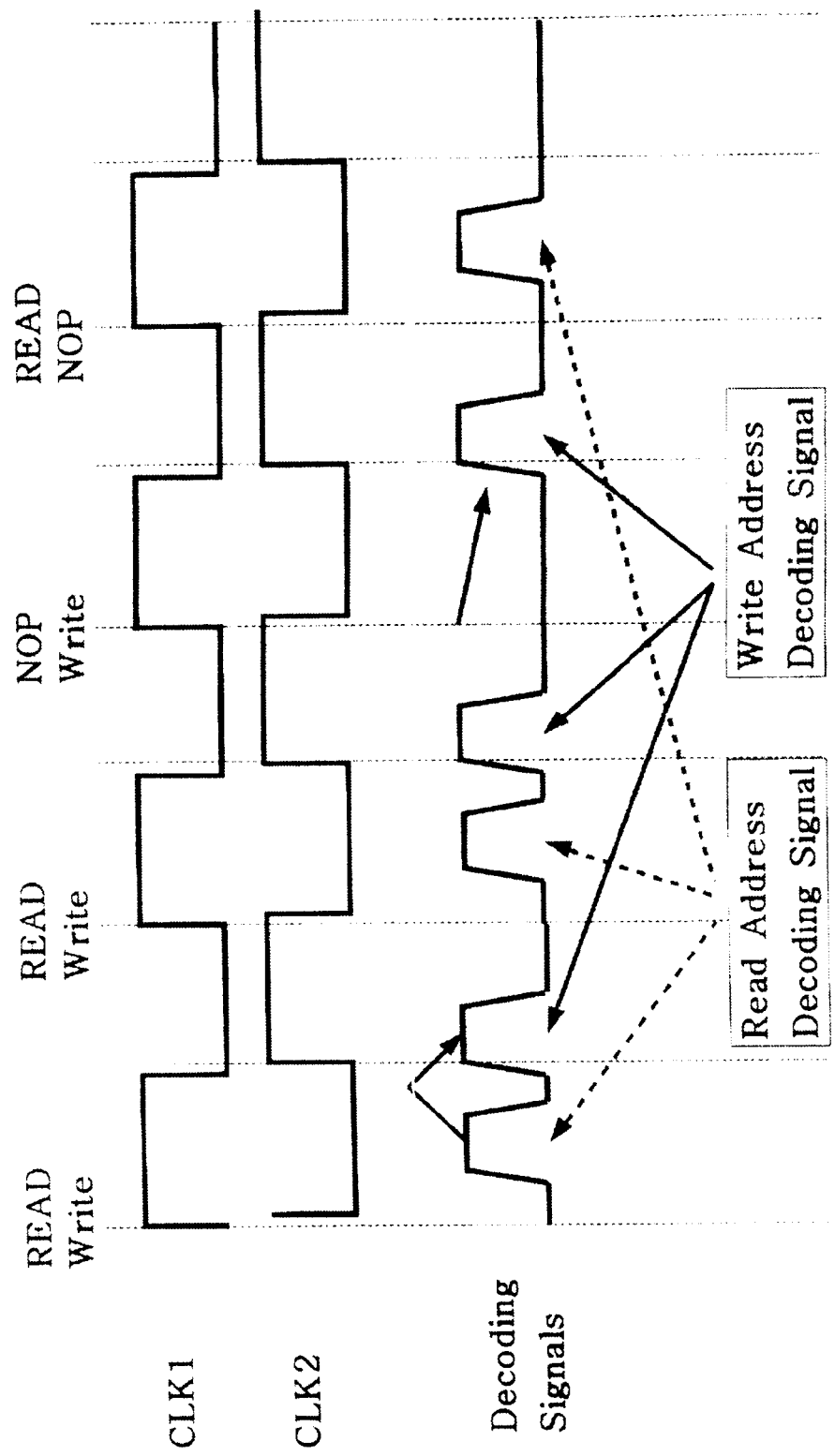
FIG. 6 is a timing diagram illustrating operation of the system of FIG. 5.

FIG. 6 is a timing diagram illustrating a mode of operation of the embodiment shown in FIG. 5. When a read operation and a write operation are performed at the same time such as in the first and second cycles, the write address decoding signal serves to track a read address decoding signal. However, in the case of no operation (NOP) such as in the third cycle, the write address is synchronized with the rising edge of the CLK1 to thereby be decoded. The fourth cycle corresponds to a NOP in write.

In summary, as described above, the present invention can employ a data input bus and a data output bus at the same time in a semiconductor device having a structure in which an input bus and an output bus are separated, particularly in a separate I/O DDR, or a QDR RAM, thereby increasing a data rate more than two times in the same cycle time.

In addition, in a read operation and a write operation of the separate I/O DDR or the QDR(2/4) RAM, the present invention allows a subsequent read or write operation to track a random signal of an earlier write or read operation to thereafter operate while a read operation and a write operation are performed in sequential order at a same cycle, thereby minimizing cycle time.

Although illustrative embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A method for performing read and write operations in a semiconductor memory device comprising an I/O (input/output) architecture comprising a separate data input bus and data output bus, the method comprising the steps of:
    performing a read operation in synchronization with a clock signal when a read command is input at one cycle; and
    performing a write operation in the one cycle in synchronization with a signal that is generated in response to the read operation.

2. The method of claim 1, wherein the signal comprises a decoding signal that is enabled during the read operation.

3. The method of claim 1, wherein the signal comprises a main data line signal.

4. The method of claim 1, wherein the signal comprises a sense amplifier enable signal.

5. The method of claim 1, further comprising the step of performing a write operation in synchronization with the clock that is synchronized during the read operation if the read command is not input in the one cycle.

6. The method of claim 1, wherein the cycle time of the one cycle is determined by the sum of a minimum cycle time for a read operation and a minimum cycle time for a write operation.

7. The method of claim 1, wherein the I/O operates at a 4-bit burst double data rate using one of a 2-bit prefetch and 4-bit prefetch mode.

8. The method of claim 1, wherein the synchronization with the clock during the read operation is based on a rising edge of the clock.

9. A method for performing read and write operations in a semiconductor memory device comprising an I/O (input/output) architecture comprising a separate data input bus and data output bus, the method comprising the steps of:
    performing a write operation in synchronization with a clock when a write command is input at one cycle; and
    performing a read operation in the one cycle in synchronization with a signal that is generated in response to the write operation.

10. The method of claim 9, wherein the signal comprises a decoding signal that is enabled during the write operation.

11. The method of claim 9, wherein the signal comprises a write driver enable signal.

12. The method of claim 9, wherein the signal comprises a write driver disable signal.

13. The method of claim 9, further comprising the step of performing a read operation in synchronization with the clock that is synchronized during a write operation, if the write command is not input in the one cycle.

14. The method of claim 9, wherein the cycle time in the one cycle is determined by the sum of a minimum cycle time for a write operation and a minimum cycle time for a read operation.

15. The method of claim 9, wherein the I/O operates at a 4-bit burst double data rate using one of a 2-bit prefetch and 4-bit prefetch mode.

16. The method of claim 9, wherein the synchronization with the clock during the read operation is based on the rising edge of the clock.

17. The method of claim 9, further comprising the step of performing a write operation in a following cycle when data is input earlier than a write address in a write operation mode.

18. A method for performing read and write operations in a semiconductor memory device comprising an I/O (input/output) architecture comprising a separate data input bus and data output bus, the method comprising the steps of:
    performing a read operation in synchronization with a rising edge of a first clock when a read command is input; and
    performing a write operation in synchronization with a rising edge of a second clock, wherein data input is performed at each rising edge of the first and second clock.

19. The method of claim 18, wherein a time difference between the rising edge time of the first clock and the rising time of the second clock is $(tCYC/2-\alpha) \leq t1 \leq (tCYC/2+\beta)$, wherein, tCYC denotes a minimum cycle time in one cycle, and wherein α and β denote a change in time difference between the rising edge of the first clock and the rising edge of the second clock, and wherein the minimum cycle time in one cycle of memory is determined by tCYC=2×{MAX [tCYC(Read)+α, tCYC(Write)+β]}, wherein tCYC(Read) is a minimum cycle time for a read operation and tCYC(Write) is a minimum cycle time for a write operation.

20. A method for performing read and write operations in a semiconductor memory device comprising an I/O (input/output) architecture comprising a separate data input bus and data output bus, the method comprising the steps of:

performing a write operation in synchronization with a rising edge of a first clock when a write command is input, wherein data input is performed at each rising edge of the first and second clock; and performing a read operation in synchronization with a rising edge of a second clock.

21. The method of claim 20, wherein a time difference between the rising edge time of the first clock and the rising time of the second clock is $(tCYC/2-\alpha) \leq t1 \leq (tCYC/2+\beta)$, wherein tCYC denotes a minimum cycle time in one cycle, and wherein α and β denote a change in time difference between the rising edge of the first clock and the rising edge of the second clock, and wherein the minimum cycle time in one cycle of memory is determined by tCYC=2×{MAX [tCYC(Write)+α, tCYC(Read)], wherein tCYC(Write) is a minimum cycle time for a write operation and tCYC(Read) is a minimum cycle time for a read operation.

22. An apparatus for performing read and write operations in a semiconductor memory device comprising an I/O (input/output) architecture comprising a separate data input bus and data output bus, the apparatus comprising:

an address register for latching an a read address or a write address;

a clock buffer for receiving clock signals;

a decoder for decoding a read or write address that is latched by the address register;

a memory cell array for enabling word lines and row paths in response to an address decoding signal received from the decoder;

a sense amplifier that is enabled for a read operation when a word line and a row path are enabled;

a write driver that is enabled for a write operation to write data in a cell when a word line and a row path are enabled;

a data output register for latching output data and outputting the output data in synchronization with a clock in a following cycle after the sense amplifier is enabled;

a data input register; and a controller for tracking a random signal that is generated in response to an earlier read or write operation to thereby synchronize a subsequent write or read operation.

23. The apparatus of claim 22, wherein when a read address is decoded by the decoder prior to a write address in one cycle, the controller tracks a read address decoding signal to thereby generate a control signal, and thereafter controls tracking so that read and write operations are performed in the memory cell array by controlling the decoding of the write address.

24. The apparatus of claim 22, wherein when a write address is decoded by the decoder prior to a read address in one cycle, the controller tracks a write address decoding signal to thereby generate a control signal, and thereafter controls tracking so that write and read operations are performed in the memory cell array by controlling the decoding of the read address.

25. The apparatus of claim 22, wherein the random signal comprises a main data line signal and a sense amplifier enable signal when a read operation is performed prior to a write operation in one cycle.

26. The apparatus of claim 25, wherein when the controller controls a write operation in synchronization with a read signal, the controller controls the write operation in synchronization with a clock signal when a read command is not input during tracking.

27. The apparatus of claim 22, wherein the random signal comprises a write driver enable signal and a write driver disable signal when a write operation is performed prior to a read operation in one cycle.

28. The apparatus as claimed in claim 27, wherein when the controller controls a read operation in synchronization with a write signal, the controller controls the read operation in synchronization with a clock signal when a write command in not input during tracking.

* * * * *